(12) United States Patent
Rachmady et al.

(10) Patent No.: US 8,264,048 B2
(45) Date of Patent: Sep. 11, 2012

(54) MULTI-GATE DEVICE HAVING A T-SHAPED GATE STRUCTURE

(75) Inventors: Willy Rachmady, Beaverton, OR (US); Uday Shah, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 659 days.

(21) Appl. No.: 12/032,603

(22) Filed: Feb. 15, 2008

(65) Prior Publication Data

US 2009/0206406 A1 Aug. 20, 2009

(51) Int. Cl.
*H01L 29/78* (2006.01)
*H01L 21/336* (2006.01)

(52) U.S. Cl. ........ 257/401; 257/213; 257/288; 257/365; 257/623

(58) Field of Classification Search .................. 257/213, 257/288, 386, 401, E29.264, E21.421, 331, 257/365, 623
See application file for complete search history.

(56) References Cited

U.S. PATENT DOCUMENTS

| | | | | |
|---|---|---|---|---|
| 5,053,348 A * | 10/1991 | Mishra et al. | ............. | 438/571 |
| 5,559,049 A * | 9/1996 | Cho | ............. | 438/304 |
| 5,686,325 A * | 11/1997 | Moriuchi et al. | ............. | 438/571 |
| 6,075,262 A * | 6/2000 | Moriuchi et al. | ............. | 257/280 |
| 6,355,556 B1 * | 3/2002 | Tseng | ............. | 438/638 |
| 6,653,700 B2 | 11/2003 | Chau et al. | | |
| 6,696,345 B2 | 2/2004 | Chau et al. | | |
| 6,780,694 B2 * | 8/2004 | Doris et al. | ............. | 438/182 |
| 6,784,491 B2 * | 8/2004 | Doyle et al. | ............. | 257/346 |
| 6,808,993 B2 | 10/2004 | Finnie et al. | | |
| 6,858,478 B2 | 2/2005 | Chau et al. | | |
| 6,887,800 B1 | 5/2005 | Metz et al. | | |
| 6,893,927 B1 | 5/2005 | Shah et al. | | |
| 6,914,295 B2 * | 7/2005 | Chau et al. | ............. | 257/333 |
| 6,939,815 B2 | 9/2005 | Brask et al. | | |
| 6,952,040 B2 | 10/2005 | Chau et al. | | |
| 6,974,764 B2 | 12/2005 | Brask et al. | | |
| 6,992,358 B2 * | 1/2006 | Hieda et al. | ............. | 257/407 |

(Continued)

OTHER PUBLICATIONS

Rachmady, Willy et al., "Highly-Selective Metal Etchants", U.S. Patent Application Filed Aug. 8, 2006 assigned U.S. Appl. No. 11/501,379.

(Continued)

*Primary Examiner* — Long K. Tran
*Assistant Examiner* — Jordan Klein
(74) *Attorney, Agent, or Firm* — Cool Patent, P.C.; Joseph P. Curtin

(57) ABSTRACT

A multi-gate device having a T-shaped gate structure is generally described. In one example, an apparatus includes a semiconductor substrate, at least one multi-gate fin coupled with the semiconductor substrate, the multi-gate fin having a gate region, a source region, and a drain region, the gate region being positioned between the source and drain regions, a gate dielectric coupled to the gate region of the multi-gate fin, a gate electrode coupled to the gate dielectric, the gate electrode having a first thickness and a second thickness, the second thickness being greater than the first thickness, a first spacer dielectric coupled to a portion of the gate electrode having the first thickness, and a second spacer dielectric coupled to the first spacer dielectric and coupled to the gate electrode where the second spacer dielectric is coupled to a portion of the gate electrode having the second thickness.

12 Claims, 4 Drawing Sheets

U.S. PATENT DOCUMENTS

| | | | |
|---|---|---|---|
| 6,998,686 | B2 | 2/2006 | Chau et al. |
| 7,005,366 | B2 | 2/2006 | Chau et al. |
| 7,037,845 | B2 | 5/2006 | Chau et al. |
| 7,045,428 | B2 | 5/2006 | Brask et al. |
| 7,071,064 | B2 * | 7/2006 | Doyle et al. .................. 438/283 |
| 7,074,680 | B2 | 7/2006 | Doczy et al. |
| 7,084,038 | B2 | 8/2006 | Doczy et al. |
| 7,129,182 | B2 | 10/2006 | Chau et al. |
| 7,138,323 | B2 | 11/2006 | Chau et al. |
| 7,148,548 | B2 | 12/2006 | Doczy et al. |
| 7,153,734 | B2 | 12/2006 | Brask et al. |
| 7,153,784 | B2 | 12/2006 | Brask et al. |
| 7,157,378 | B2 | 1/2007 | Brask et al. |
| 7,160,767 | B2 | 1/2007 | Brask et al. |
| 7,176,090 | B2 * | 2/2007 | Brask et al. .................. 438/270 |
| 7,183,184 | B2 | 2/2007 | Doczy et al. |
| 7,208,361 | B2 | 4/2007 | Shah et al. |
| 7,217,611 | B2 | 5/2007 | Kavalieros et al. |
| 7,220,635 | B2 | 5/2007 | Brask et al. |
| 2004/0007724 | A1 | 1/2004 | Murthy et al. |
| 2004/0036126 | A1 | 2/2004 | Chau et al. |
| 2004/0256673 | A1 * | 12/2004 | Doyle et al. .................. 257/346 |
| 2004/0259340 | A1 * | 12/2004 | Chu et al. ...................... 438/585 |
| 2005/0224880 | A1 * | 10/2005 | Lee et al. ...................... 257/347 |
| 2005/0269644 | A1 * | 12/2005 | Brask et al. .................. 257/369 |
| 2005/0272191 | A1 | 12/2005 | Shah et al. |
| 2006/0006522 | A1 | 1/2006 | Doczy et al. |
| 2006/0046401 | A1 * | 3/2006 | Kavalieros et al. ........... 438/283 |
| 2006/0051957 | A1 * | 3/2006 | Brask et al. .................. 438/637 |
| 2006/0063319 | A1 * | 3/2006 | Ono .............................. 438/197 |
| 2007/0018238 | A1 * | 1/2007 | Ono .............................. 257/327 |
| 2007/0045753 | A1 | 3/2007 | Pae et al. |
| 2007/0287255 | A1 | 12/2007 | Doyle et al. |
| 2008/0003755 | A1 | 1/2008 | Shah et al. |

OTHER PUBLICATIONS

Datta, Suman et al., "SRAM and Logic Transistors With Variable Height Multi-Gate Transistor Architecture", U.S. Patent Application Filed Dec. 29, 2006 assigned U.S. Appl. No. 11/648,521.

Rachmady, Willy et al., "Selective Anisotropic Wet Etching of Workfunction Metal for Semiconductor Devices", U.S. Patent Application Filed Sep. 22, 2006 assigned U.S. Appl. No. 11/525,765.

Rachmady, Willy et al., "Transistor, Method of Manufacturing Same, Etchant for Use During Manufacture of Same, and System Containing Same", U.S. Patent Application Filed Nov. 30, 2006 assigned U.S. Appl. No. 11/607,549.

Shah, Uday et al., "CMOS Structure and Method of Manufacturing Same", U.S. Patent Application Filed Mar. 30, 2007 assigned U.S. Appl. No. 11/731,163.

Chau, Robert S., et al., "A CMOS Device With Metal and Silicide Gate Electrodes and a Method for Making It", U.S. patent application Filed Nov. 2, 2006 assigned U.S. Appl. No. 11/556,025.

Chau, Robert S., et al., "Replacement Metal Gate/High K Dielectric Scheme for FIN-FET Transistors", U.S. Patent Application filed Nov. 21, 2007 assigned U.S. Appl. No. 11/986,510.

Kavalieros, Jack T., et al., "An Apparatus and Method for Selectively Recessing Spacers on Multi-Gate Devices", U.S. Patent Application filed Sep. 15, 2006 assigned U.S. Appl. No. 11/521,624.

Singh, Rajwinder et al., "Method of Forming a Selective Spacer in a Semiconductor Device", U. S. Patent Application filed Dec. 29, 2006 assigned U.S. Appl. No. 11/648,512.

Rachmady, Willy et al., "High K Dielectric Materials Integrated Into Multi-Gate Transistor Structures", U.S. Patent application filed Jun. 19, 2007 assigned U.S. Appl. No. 11/765,023.

Ban, Ibrahim et al., "Localized Spacer for a Multi-Gate Transistor", U.S. Patent application filed Mar. 28, 2007 assigned U.S. Appl. No. 11/729,033.

Shah, Uday, et al., "Tri-Gate Patterning Using Dual Layer Gate Stack", U.S. Patent Application Filed Dec. 28, 2007 assigned U.S. Appl. No. 12/006,047.

* cited by examiner a)

b)

MULTI-GATE DEVICE HAVING A T-SHAPED GATE STRUCTURE

BACKGROUND

Generally, the scaling of multi-gate devices or non-planar transistors, such as tri-gate devices, makes electrode fill in the gate region more difficult.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
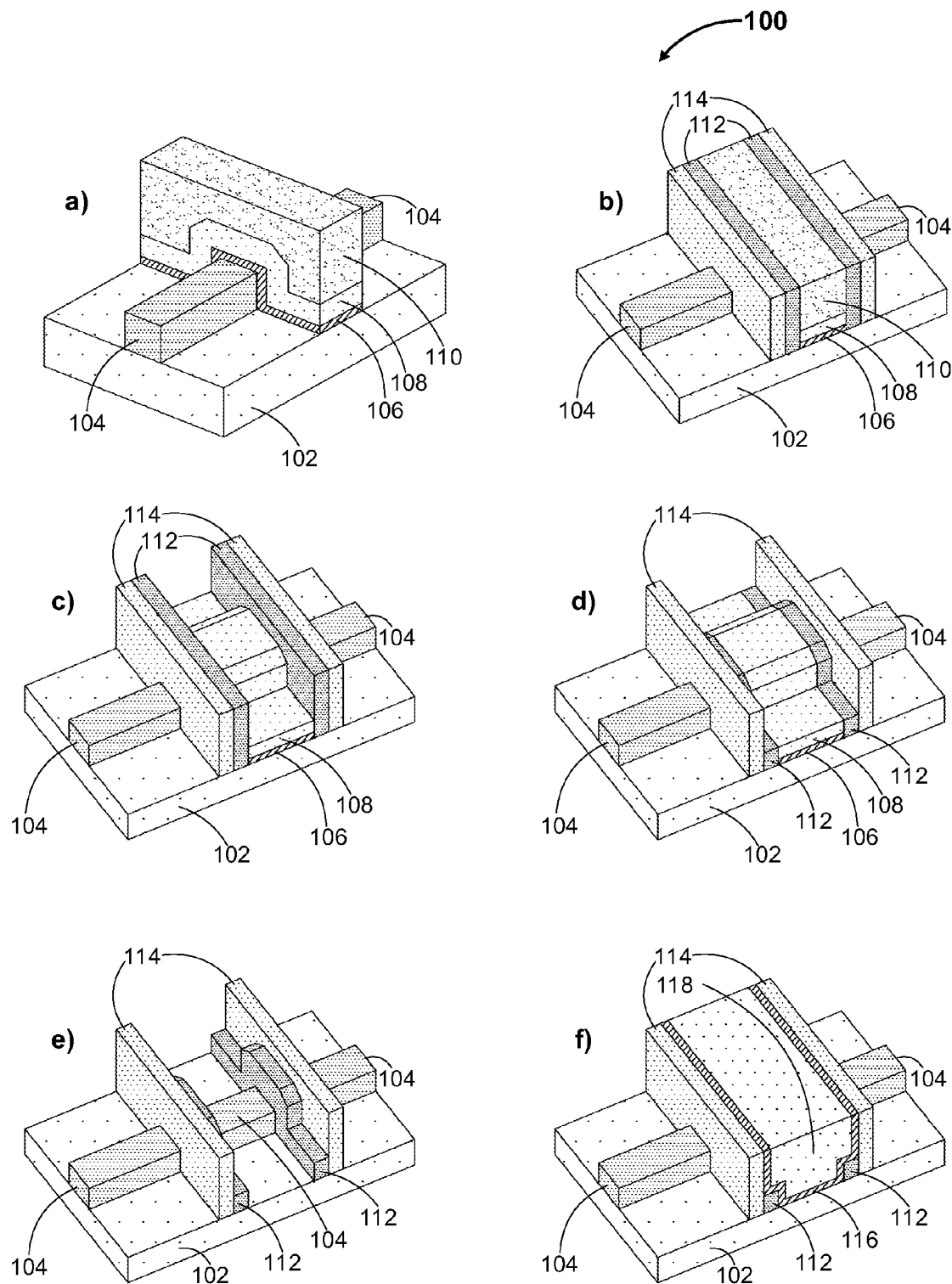
FIGS. 1a-f depict a process schematic for fabricating a T-shaped gate structure, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of a multi-gate device having a T-shaped gate structure are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIGS. 1a-f depict a process schematic for fabricating a T-shaped gate structure, according to but one embodiment. FIGS. 1a-f may depict cross-sections of a multi-gate device near a fin region. The gate electrode fill process, such as metal gate fill, may be approaching a capability limit as multi-gate devices are scaled to smaller sizes. The gate trench aspect ratio may be greater for non-planar device architecture, such as tri-gate, than for planar device architecture. By incorporating a T-shape gate structure in a multi-gate device, metal fill capability may be further extended while maintaining aggressive gate length (Lg) scaling.

In an embodiment according to FIG. 1a, an apparatus 100 includes a semiconductor substrate 102, a multi-gate fin or pillar 104, and a dummy gate pedestal including a dummy gate dielectric 106, a first dummy gate material 108, and a second dummy gate material 110, each coupled as shown. The semiconductor substrate 102 may include silicon, any other suitable semiconductor material, or combinations thereof, and may include bulk or silicon-on-insulator (SOI) substrates, for example, in one or more embodiments. A multi-gate fin 104 may include silicon, any other suitable semiconductor material, or combinations thereof.

In an embodiment, apparatus 100 includes a non-planar or multi-gate high-k/metal gate transistor fabricated via a replacement metal gate (RMG) process flow. In another embodiment, the multi-gate fin 104 is a tri-gate fin that is part of a transistor having a gate length of about 22 nm or less.

Materials for a dummy gate pedestal 106, 108, 110 may be selected for etch selectivity to allow patterning according to embodiments described herein. In an embodiment, the dummy gate dielectric 106 includes oxide, the first dummy gate material 108 includes polysilicon, and the second dummy gate material 110 includes silicon germanium (SiGe). The dummy gate pedestal 106, 108, 110 may be planarized.

In an embodiment according to FIG. 1b, an apparatus 100 includes a semiconductor substrate 102, a multi-gate fin 104, dummy gate dielectric 106, first dummy gate material 108, second dummy gate material 110, first spacer dielectric film 112, and second spacer dielectric film 114, each coupled as shown. FIG. 1b may be a depiction of FIG. 1a after deposition of a first spacer dielectric film 112 and deposition of a second spacer dielectric film 114. In another embodiment, FIG. 1b is a depiction of FIG. 1a after spacer dielectric 112, 114 deposition, source/drain formation, inter-layer dielectric (ILD) deposition, and/or polishing the ILD to expose the dummy gate pedestal 110 for further processing.

Multi-gate fin 104 may include a source region, a drain region, and a gate region, the gate region being disposed between the source and drain regions. The source and drain regions may include the visible portions of multi-gate fin 104 in FIG. 1a and the gate region may include the portion of multi-gate fin 104 covered by the dummy gate pedestal 106, 108, 110 in FIG. 1a, but visible in FIG. 1e. Source/drain formation may include implanting the source and drain regions of multi-gate fin 104. In an embodiment, ILD includes a dielectric material such as carbon-doped oxide (CDO), chemical vapor deposition (CVD) oxide, or any other suitable dielectric material. ILD may not be depicted in FIGS. 1a-f for the sake of clarity, but may be included in one or more embodiments of apparatus 100.

In an embodiment, a dummy gate pedestal 106, 108, 110 has at least a first surface, a second surface, and a third surface where the first and second surfaces are substantially parallel to one another and where the third surface is substantially perpendicular to the first and second surfaces. In an embodiment, first spacer dielectric film 112 is deposited to substantially cover the first and second surfaces of the dummy gate pedestal 106, 108, 110. Second spacer dielectric film 114 may be deposited to substantially cover the first spacer dielectric film 112.

Materials for first 112 and second 114 spacer dielectric films may be selected to provide etch selectivity according to embodiments described herein. In an embodiment, a first spacer dielectric film 112 includes silicon nitride (SiN) and a second spacer dielectric film 114 includes carbon-doped silicon nitride (CDN).

In an embodiment according to FIG. 1c, an apparatus 100 includes a semiconductor substrate 102, multi-gate fin 104, dummy gate dielectric 106, first dummy gate material 108, first spacer dielectric film 112, and second spacer dielectric film 114, each coupled as shown. FIG. 1c may be a depiction of FIG. 1b after a second dummy gate material 110 has been selectively removed. In an embodiment, a second dummy gate material 110 including SiGe is etched out using a wet etch process. SiGe may be etched using a solution that includes acetic acid, nitric acid, and hydrofluoric acid. Because of the etchant's unique selectivity, this etch-out process stops on the underlying first dummy gate material 108, partially exposing the first spacer dielectric film 112 as depicted. In an embodiment, the first dummy gate material 108 includes polysilicon as an etch-stop.

In an embodiment according to FIG. 1d, an apparatus 100 includes a semiconductor substrate 102, multi-gate fin 104, dummy gate dielectric 106, first dummy gate material 108, first spacer dielectric film 112, and second spacer dielectric film 114, each coupled as shown. FIG. 1d may be a depiction of FIG. 1c after the partially exposed first spacer dielectric film 112 has been recessed. A first spacer dielectric film 112 including SiN may be recessed or selectively removed as depicted in FIG. 1d by etching with phosphoric acid leaving only first spacer dielectric film 112 that is masked by the first dummy gate material 108 including polysilicon, for example. In an embodiment, a portion of the first spacer dielectric film 112 previously coupled to the second dummy gate material 110 in FIG. 1b is selectively removed in FIG. 1d. In an embodiment, the second spacer dielectric film 112 including CDN remains intact based on the etch selectivity of phosphoric acid. The etch rate of CDN may significantly lower than that of SiN in phosphoric acid.

In an embodiment according to FIG. 1e, an apparatus 100 includes a semiconductor substrate 102, multi-gate fin 104, first spacer dielectric film 112, and second spacer dielectric film 114, each coupled as shown. FIG. 1e may be a depiction of FIG. 1d after removal of the first dummy gate material 108 and the dummy gate dielectric 106. In an embodiment, first dummy gate material 108 is etched out using trimethylammonium hydroxide (TMAH), ammonium hydroxide, potassium hydroxide, or any other suitable etch process. Dummy gate dielectric 106 may be etched out using any suitable etch process.

In an embodiment, removing the first dummy gate material 108 and dummy gate dielectric 106 forms a T-shaped trench surrounding the three sides of the multi-gate fin 104 surface that serve as a tri-gate transistor channel. The T-shaped trench may be better visualized by reference to FIG. 1f where a gate dielectric 116 and gate electrode material 118 has filled the T-shaped trench. FIGS. 2a-b further depict the T-shaped gate structure. In an embodiment, selectively removing the first dummy gate material 108 forms a T-shaped trench wherein a cross-section of the trench contained between the first 112 and second 114 spacer dielectric films along the multi-gate fin 104 has a substantially T-shaped structure. A T-shaped structure as described may decrease gate region resistivity by facilitating gate electrode 118 fill in the gate region. In an embodiment, a T-shaped structure increases gate electrode 118 fill volume in the gate region.

In an embodiment according to FIG. 1f, an apparatus 100 includes a semiconductor substrate 102, multi-gate fin 104, first spacer dielectric film 112, second spacer dielectric film 114, gate dielectric 116, and gate electrode 118. FIG. 1f may be a depiction of FIG. 1e after a T-shaped gate stack or structure 118 has been formed in the T-shaped trench. A gate dielectric 116 may be a high-k dielectric including oxide. The gate dielectric 116 may be deposited to substantially cover the surfaces of the exposed semiconductor fin 104 in the gate region, including the sidewalls and the top surface. A gate electrode 118 may be a workfunction metal that substantially fills the T-shaped trench. The number tag for gate electrode 118 may point to a cross-section surface of a T-shaped gate structure formed by gate electrode 118 fill.

In an embodiment, an apparatus 100 includes a semiconductor substrate 102, at least one multi-gate fin 104 coupled with the semiconductor substrate 102, the multi-gate fin 104 including a gate region, a source region, and a drain region, the gate region being disposed between the source and drain regions. An apparatus 100 may further include a gate dielectric 116 coupled to the gate region of the multi-gate fin 104, a gate electrode 118 coupled to the gate dielectric 116, the gate electrode 118 having a first thickness and a second thickness, the second thickness being greater than the first thickness. A first and second thickness is further described with respect to FIG. 2

In an embodiment, an apparatus 100 further includes a first spacer dielectric 112 coupled to a portion of the gate electrode 118 having the first thickness, and a second spacer dielectric 114 coupled to the first spacer dielectric 112 and coupled to the gate electrode 118 wherein the second spacer dielectric 114 is coupled to a portion of the gate electrode 118 having the second thickness. In another embodiment, the second spacer dielectric 114 is directly coupled only to the portion of the gate electrode 118 having the second thickness and is not directly coupled to the portion of the gate electrode 118 having the first thickness. In an embodiment, the first spacer dielectric 112 is disposed between the second spacer dielectric 114 and the gate electrode 118 in the region where the gate electrode 118 has a first thickness. The first spacer dielectric 112 may form a narrower region within a T-shaped trench that results in the gate electrode 118 having a narrower first thickness.

A cross-section of the gate electrode 118 along the multi-gate fin 104 may have a substantially T-shaped structure to decrease gate electrode 118 resistivity by increasing gate electrode 118 fill in the gate region.

FIGS. 2a-b are cross-section depictions of a T-shaped gate structure, according to but one embodiment. In an embodiment, an apparatus 200 includes a multi-gate fin 202 and a T-shaped gate electrode structure 204, where other structures such as spacer dielectric films have been omitted to more clearly depict the T-shaped structure of the gate electrode 204.

FIG. 2a may depict a cross-section of a T-shaped gate electrode structure 204 through the multi-gate fin 202 while FIG. 2b may depict a cross-section of a T-shaped gate electrode structure 204 in a region adjacent to the multi-gate fin 202, but not through the multi-gate fin 202. Both FIGS. 2a and 2b depict a gate electrode structure 204 having a first thickness, T1, and a second thickness T2, where T2 is greater than T1. In an embodiment, a first spacer dielectric (not shown) is coupled to a portion of the gate electrode 204 having the first thickness (T1) and a second spacer dielectric (not shown) is coupled to the first spacer dielectric and coupled to a portion of the gate electrode 204 having the second thickness (T2).

In another embodiment, a second spacer dielectric is directly coupled only to a portion of the gate electrode 204 having the second thickness (T2) and is not directly coupled to the portion of the gate electrode 204 having the first thickness (T1). The second spacer dielectric may be directly coupled to other structures of a multi-gate device other than the gate electrode 204 having the first thickness (T1). In an embodiment, a first spacer dielectric is disposed between a second spacer dielectric and the gate electrode 204 in the region where the gate electrode 204 has a first thickness (T1). The first spacer dielectric may form a narrower region within a T-shaped trench that results in the gate electrode 204 having a narrower first thickness (T1) after gate electrode 204 fill.

Figure 3:
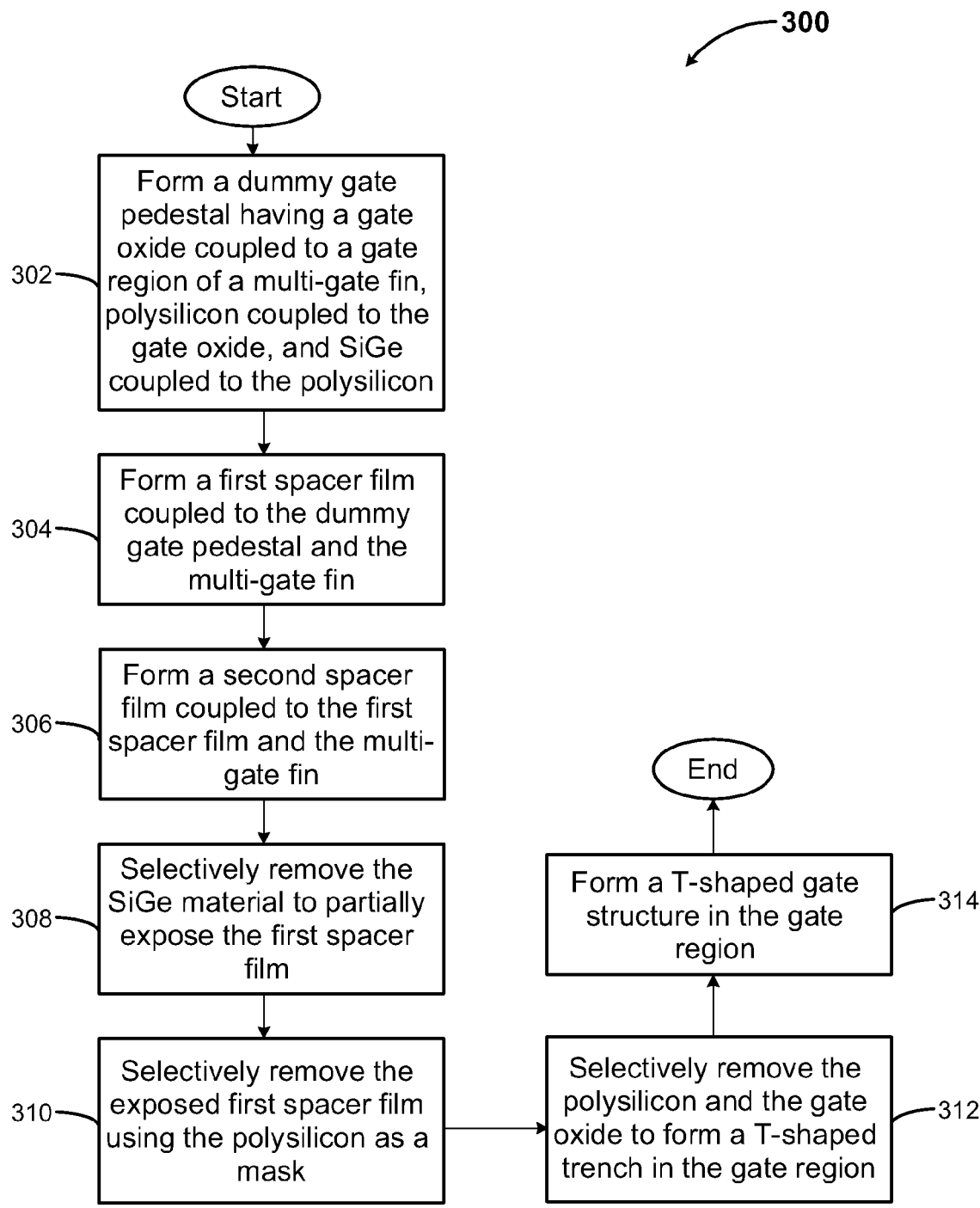
FIG. 3 is a flow diagram of a method for fabricating a T-shaped gate structure, according to but one embodiment.

FIG. 3 is a flow diagram of a method for fabricating a T-shaped gate structure, according to but one embodiment. In an embodiment, a method 300 includes forming a dummy gate pedestal having a dummy gate dielectric, a first dummy gate material, and a second dummy gate material in the gate region of a multi-gate fin 302, forming a first spacer film coupled to the dummy gate pedestal and the multi-gate fin 304, forming a second spacer film coupled to the first spacer film and the multi-gate fin 306, selectively removing the second dummy gate material to partially expose the first spacer film 308, selectively removing the exposed first spacer film using the first dummy gate material as a mask 310, selectively removing the first dummy gate material and the dummy gate dielectric to form a T-shaped trench in the gate region 312, and forming a T-shaped gate structure in the gate region 314.

In an embodiment, a method 300 includes forming a dummy gate pedestal 302 having at least a first surface, a second surface, and a third surface where the first and second surfaces are substantially parallel to one another and wherein the third surface is substantially perpendicular to the first and second surfaces, the dummy gate pedestal including a dummy gate dielectric coupled to a gate region of a multi-gate fin, a first dummy gate material coupled to the dummy gate dielectric, and a second dummy gate material coupled to the first dummy gate material.

Forming a dummy gate pedestal 302 may include depositing a dummy gate dielectric to the gate region of a multi-gate fin, depositing a first dummy gate material to the dummy gate dielectric, depositing a second dummy gate material to the first dummy gate material, and smoothing the second dummy gate material surface using a polish or etch process, or suitable combinations thereof. A dummy gate dielectric may include an oxide, the first dummy gate material may include polysilicon, and the second dummy gate material may include SiGe. Other materials that perform similar functions or that can be processed in accordance with embodiments herein may also be used to form a dummy gate pedestal. Forming a dummy gate pedestal 302 may include forming a dummy gate pedestal 302 coupled to a gate region of a tri-gate fin where the tri-gate fin is part of a transistor device having a gate length of about 22 nm or less.

A method 300 may further include depositing a first spacer dielectric film to the first and second surfaces of the dummy gate pedestal 304 and depositing a second spacer dielectric film to the first spacer film 306. Depositing a first spacer dielectric film 304 may include depositing silicon nitride (SiN) and depositing a second spacer dielectric film 306 may include depositing carbon-doped silicon nitride (CDN).

In an embodiment, a method 300 includes forming a source and drain region in the multi-gate fin after depositing a second spacer dielectric film 306 and prior to selectively removing the second material of the dummy gate pedestal 308. The gate region of a multi-gate fin may be disposed between the source and drain regions. Forming a source and drain region may include at least implanting the source and drain regions with a dopant. A method 300 may further include depositing an inter-layer dielectric (ILD) to the source region, drain region, and gate region of the multi-gate fin and polishing the ILD to expose the second dummy gate material of the dummy gate pedestal.

In an embodiment, a method 300 includes selectively removing the second dummy gate material of the dummy gate pedestal 308 to expose a portion of the first spacer dielectric film previously coupled to the second dummy gate material. Selectively removing the second dummy gate material of the dummy gate pedestal 308 may include etching the second dummy gate material using a wet etch solution that includes acetic acid, nitric acid, and hydrofluoric acid.

A method 300 may include selectively removing the portion of the first spacer dielectric film previously coupled to the second dummy gate material 310. Selectively removing the portion of the first spacer dielectric film previously coupled to the second dummy gate material 310 may include etching with phosphoric acid. The first dummy gate material may serve as an etch mask to prevent removal of the first spacer dielectric film directly coupled to the first dummy gate material.

A method 300 may include selectively removing the first dummy gate material and the dummy gate dielectric to form a T-shaped trench in the gate region 312. Selectively removing the first dummy gate material and the dummy gate dielectric 312 may include etching with trimethylammonium hydroxide (TMAH), ammonium hydroxide, potassium hydroxide, or suitable combinations thereof. Selectively removing the first dummy gate material 312 may form a T-shaped trench wherein a cross-section of the trench contained between the first and second spacer dielectric films along the multi-gate fin has a substantially T-shaped structure to decrease gate region resistivity by facilitating gate electrode fill in the gate region.

A method 300 may include forming a T-shaped gate stack in the T-shaped trench 314. Forming a T-shaped gate stack in the T-shaped trench 314 may include depositing a high-k gate oxide, for example, to the gate region of the multi-gate fin and depositing a workfunction metal such as aluminum, copper, or gold, for example, to the high-k gate oxide to substantially fill the T-shaped trench.

According to an embodiment, selectively removing the second dummy gate material of the dummy gate pedestal 308, selectively removing the portion of the first spacer dielectric film previously coupled to the second dummy gate material 310, and selectively removing the first dummy gate material and the dummy gate dielectric 312 include highly selective wet etch processes and do not include dry etch processes to reduce damage associated with dry etch processes (i.e.—plasma damage concerns).

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 4:
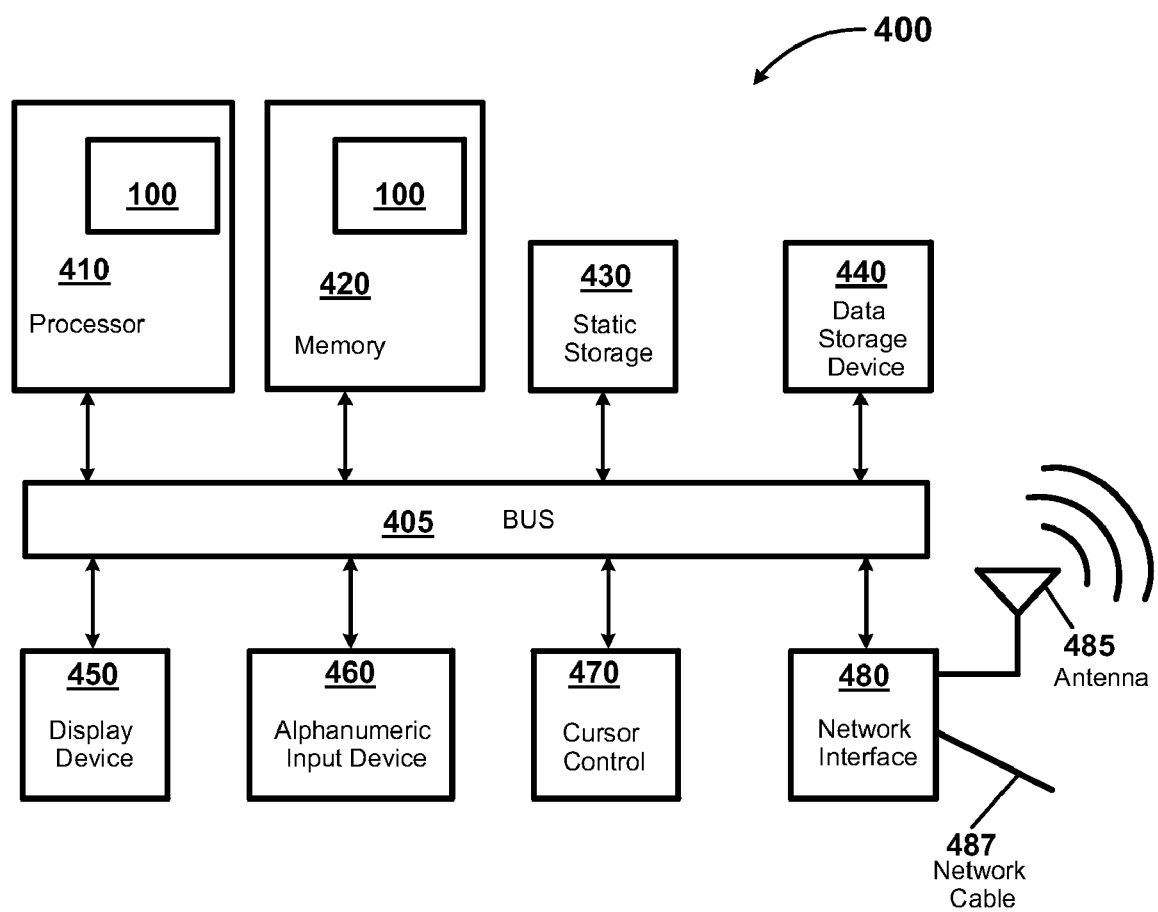
FIG. 4 is a diagram of an example system in which embodiments of the present invention may be used, according to but one embodiment.

FIG. 4 is a diagram of an example system in which embodiments of the present invention may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

Figure 2:
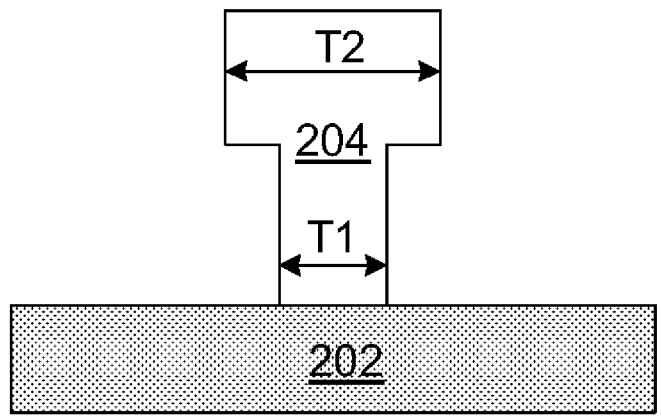
FIGS. 2a-b are cross-section depictions of a T-shaped gate structure, according to but one embodiment.
Figure 2:
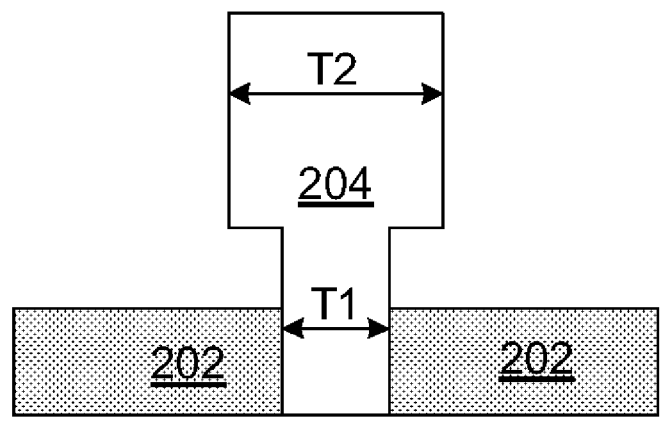

In one embodiment, electronic system 400 includes an apparatus having a T-shaped gate structure 100 in accordance with embodiments described with respect to FIGS. 1-3. In an embodiment, an apparatus having a T-shaped gate structure 100 as described herein is part of an electronic system's processor 410 or memory 420.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes an apparatus having a T-shaped gate structure 100 in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes apparatus having a T-shaped gate structure 100 as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 400 includes one or more omnidirectional antennae 485, which may refer to an antenna that is at least partially omnidirectional and/or substantially omnidirectional, and a processor 410 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:

a semiconductor substrate;

at least one multi-gate fin coupled with the semiconductor substrate, the at least one multi-gate fin comprising a first side, a second side, a third side and a fourth side, the fourth side of the at least one multi-gate fin being adjacent to the semiconductor substrate, the multi-gate fin further comprising a gate region, a source region, and a drain region, the gate region being disposed between the source and drain regions;

a gate electrode coupled to a gate dielectric, the gate electrode comprising a first portion comprising a first thickness and a second portion comprising a second thickness, the second thickness being greater than the first thickness, the first and second thicknesses extending between the source and drain regions, the first portion of the gate electrode comprising surfaces that correspond to a first part of the first, second and third sides of the at least one multi-gate fin and the second portion of the gate electrode comprising surfaces that correspond to a second and a third part of the first, second and third sides of the at least one multi-gate fin, the first part of the first, second and third sides of the at least one multi-gate fin being disposed between the second and third parts of the first, second and third sides of the at least one multi-gate fin, and a cross-section of the gate electrode along the multi-gate fin having a substantially T-shaped structure; and the gate dielectric being coupled to the first, second and third parts of the first, second and third sides of the gate region of the multi-gate fin and the gate electrode between the gate region of the multi-gate fin and the gate electrode, the gate dielectric being coupled to the surfaces of the first portion of the gate electrode corresponding to the first, second and third sides of the gate region of the at least one multi-gate fin, and to the surfaces of the second portion of the gate electrode corresponding to the first, second and third sides of the gate region of the at least one multi-gate fin.

2. An apparatus according to claim 1, further comprising:
a first spacer dielectric coupled to the portion of the gate electrode comprising the first thickness; and
a second spacer dielectric coupled to the portion of the gate electrode comprising the second thickness,
wherein the first spacer dielectric comprises silicon nitride and the second spacer dielectric comprises carbon-doped silicon nitride.

3. An apparatus according to claim 1 wherein the semiconductor substrate comprises silicon, the multi-gate fin comprises silicon, the gate dielectric comprises a high-k gate oxide, and the gate electrode comprises a workfunction metal.

4. An apparatus according to claim 1 wherein the multi-gate fin is a tri-gate fin that is part of a transistor having a gate length of about 22 nm or less.

5. An apparatus according to claim 1, further comprising:
a first spacer dielectric coupled to a first portion of the gate dielectric that is coupled to the first portion of the gate electrode comprising the first thickness; and
a second spacer dielectric coupled to the first spacer dielectric and coupled to a second portion of the gate dielectric that is coupled to the second portion of the gate electrode comprising the second thickness.

6. An apparatus according to claim 5, wherein the semiconductor substrate comprises silicon, the multi-gate fin comprises silicon, the gate dielectric comprises a high-k gate oxide, and the gate electrode comprises a workfunction metal.

7. An apparatus according to claim 6, wherein the first spacer dielectric comprises silicon nitride and the second spacer dielectric comprises carbon-doped silicon nitride.

8. An apparatus according to claim 7, wherein the multi-gate fin is a tri-gate fin that is part of a transistor having a gate length of about 22 nm or less.

9. An apparatus, comprising:
a silicon substrate;
at least one silicon multi-gate fin coupled with the silicon substrate, the at least one multi-gate fin comprising a first side, a second side, a third side and a fourth side, the fourth side of the at least one multi-gate fin being adjacent to the semiconductor substrate, the multi-gate fin further comprising a gate region, a source region, and a drain region, the gate region being disposed between the source and drain regions;
a gate electrode coupled to a gate dielectric, the gate electrode comprising a first portion comprising a first thickness and a second portion comprising a second thickness, the second thickness being greater than the first thickness, the first and second thicknesses extending between the source and drain regions, the first portion of the gate electrode comprising surfaces that correspond to a first part of the first, second and third sides of the at least one multi-gate fin and the second portion of the gate electrode comprising surfaces that correspond to a second and a third part of the first, second and third sides of the at least one multi-gate fin, the first part of the first, second and third sides of the at least one multi-gate fin being disposed between the second and third parts of the first, second and third sides of the at least one multi-gate fin, the gate electrode comprising a workfunction metal and the gate dielectric comprising a high-k gate oxide, and a cross-section of the gate electrode along the multi-gate fin having a substantially T-shaped structure; and
the gate dielectric being coupled to the first, second and third parts of the first, second and third sides of the gate region of the multi-gate fin and the gate electrode between the gate region of the multi-gate fin and the gate electrode, the gate dielectric being coupled to the surfaces of the first portion of the gate electrode corresponding to the first, second and third sides of the gate region of the at least one multi-gate fin, and to the surfaces of the second portion of the gate electrode corresponding to the first, second and third sides of the gate region of the at least one multi-gate fin.

10. An apparatus according to claim 9, further comprising:
a first spacer dielectric coupled to a first portion of the gate dielectric that is coupled to the first portion of the gate electrode comprising the first thickness; and
a second spacer dielectric coupled to the first spacer dielectric and coupled to a second portion of the gate dielectric that is coupled to the second portion of the gate electrode comprising the second thickness.

11. An apparatus according to claim 10, wherein the first spacer dielectric comprises silicon nitride and the second spacer dielectric comprises carbon-doped silicon nitride.

12. An apparatus according to claim 11, wherein the multi-gate fin is a tri-gate fin that is part of a transistor having a gate length of about 22 nm or less.

* * * * *